United States Patent
Adachi

(10) Patent No.: US 11,336,072 B2
(45) Date of Patent: May 17, 2022

(54) SEMICONDUCTOR OPTICAL DEVICE

(71) Applicant: Lumentum Japan, Inc., Kanagawa (JP)

(72) Inventor: Koichiro Adachi, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 61 days.

(21) Appl. No.: 16/547,433

(22) Filed: Aug. 21, 2019

(65) Prior Publication Data

US 2021/0044078 A1    Feb. 11, 2021

(30) Foreign Application Priority Data

Aug. 6, 2019   (JP) .............................. JP2019-144889

(51) Int. Cl.
*H01S 3/00*       (2006.01)
*H01S 3/13*       (2006.01)
(Continued)

(52) U.S. Cl.
CPC .......... *H01S 3/1305* (2013.01); *H01S 3/0085* (2013.01); *H01S 5/2022* (2013.01); *G02B 6/12004* (2013.01); *G02B 6/4201* (2013.01); *G02B 6/4232* (2013.01); *G02B 6/4239* (2013.01); *G02B 2006/12121* (2013.01);
(Continued)

(58) Field of Classification Search
CPC .... H01S 5/023; H01S 5/02325; H01S 5/0233; H01S 5/02345; H01S 5/0236; H01S 5/026; H01S 5/0265; H01S 5/0085; H01S 5/06226; H01S 5/042; G02B 2006/12121; G02B 2006/12142; G02B 6/42; G02B 6/4201; G02B 6/4232; G02B 6/4237; G02B 6/4238; G02B 6/4239; G02B 6/12; G02B 6/12004
See application file for complete search history.

(56) References Cited

U.S. PATENT DOCUMENTS 10,453,705 B2 * 10/2019 Jain ...................... H01L 21/563
2017/0025379 A1 *  1/2017 Liang ................ H01L 23/49838
2019/0237934 A1 *  8/2019 Adachi ..................... H01S 5/12

FOREIGN PATENT DOCUMENTS

JP        H07-074420 A      3/1995

OTHER PUBLICATIONS

Terminal definition from https://www.dictionary.com/browse/terminal pp. 1-4 (Year: 2021).*

* cited by examiner

*Primary Examiner* — Xinning(Tom) Niu
*Assistant Examiner* — Delma R Fordé
(74) *Attorney, Agent, or Firm* — Harrity & Harrity, LLP

(57) ABSTRACT

A semiconductor optical device includes: a laser for emitting light; a modulator for modulating the light using an electroabsorption effect; a chip capacitor that is electrically connected in parallel to the laser; a chip inductor that is electrically connected in series to the chip capacitor, is electrically connected in series to the laser and the chip capacitor as a whole, and includes a first terminal and a second terminal; a solder or a conductive adhesive that directly bonds the first terminal of the chip inductor and the chip capacitor to each other; an electrical wiring group in which the laser, the modulator, the chip capacitor, and the chip inductor are electrically connected to each other; and a substrate on which the laser, the modulator, the chip capacitor, and the chip inductor are mounted.

20 Claims, 24 Drawing Sheets

(51) Int. Cl.
  *H01S 5/20* (2006.01)
  *H01L 23/66* (2006.01)
  *H01L 23/00* (2006.01)
  *G02B 6/42* (2006.01)
  *G02B 6/12* (2006.01)
(52) U.S. Cl.
  CPC .... *G02B 2006/12142* (2013.01); *H01L 23/66* (2013.01); *H01L 24/73* (2013.01); *H01L 2223/6611* (2013.01); *H01L 2223/6638* (2013.01); *H01L 2223/6655* (2013.01); *H01L 2924/19105* (2013.01)

SEMICONDUCTOR OPTICAL DEVICE

CROSS-REFERENCE TO RELATED APPLICATION

This application claims priority to Japanese Patent Application No. 2019-144889, filed on Aug. 6, 2019, which is hereby expressly incorporated by reference herein.

TECHNICAL FIELD

The present disclosure relates to a semiconductor optical device.

BACKGROUND

As a light source for optical communication, an EA modulator integrated DFB laser in which a distributed feedback (DFB) laser and an electro absorption (EA) modulator are integrated on the same semiconductor substrate can be used. In the EA modulator integrated DFB laser, the conductive semiconductor substrate includes an electrode (for example, a cathode) common to a laser portion and a modulation portion. The laser portion emits continuous wave light (CW light) using a direct current when a direct current voltage is applied. A high frequency voltage is applied to the modulation portion such that a light absorption changes, and the modulation portion modulates CW light to generate a high frequency optical signal. The high frequency component of the voltage applied to the modulation portion leaks into the laser portion, which may cause deterioration in the characteristics of the optical signal.

A technique for suppressing the leakage of the high frequency component to the laser portion may use a passive circuit in which a capacitor and an inductor are combined. Specifically, the capacitor is connected in parallel to the laser portion, and the inductor is connected in series to both the laser portion and the capacitor.

As the inductor that forms the passive circuit, a packaged chip inductor is used in order to stably secure predetermined characteristics. In addition, due to the same reason, a chip capacitor is desirably used as the capacitor. Typically, these components are connected to each other through a wire.

However, an unintended resonance or the like is generated by a parasitic inductance of the wire itself or parasitic capacitance generated from a bonding terminal of the wire, and thus desired circuit characteristics may not be obtained. As a result, there is a problem in that the leakage of the high frequency component to the laser portion cannot be sufficiently suppressed, which causes deterioration in optical signal.

An object of the present disclosure is to provide a semiconductor optical device having improved high frequency characteristics in which the influence of a high frequency component of a voltage applied to a modulation portion on a laser portion is sufficiently suppressed by reducing a parasitic component generated during mounting.

SUMMARY

According to some possible implementations, a semiconductor optical device may include a laser for emitting light; a modulator for modulating the light using an electroabsorption effect; a chip capacitor that is electrically connected in parallel to the laser; a chip inductor that is electrically connected in series to the chip capacitor, electrically connected in series to the laser and the chip capacitor, and includes a first terminal and a second terminal; a solder or a conductive adhesive that directly bonds the first terminal of the chip inductor and the chip capacitor to each other; an electrical wiring group in which the laser, the modulator, the chip capacitor, and the chip inductor are electrically connected to each other; and a substrate on which the laser, the modulator, the chip capacitor, and the chip inductor are mounted.

According to some possible implementations, a device may include a laser for emitting light; a modulator for modulating the light; a chip capacitor that is electrically connected in parallel to the laser; a chip inductor that is electrically connected in series to the chip capacitor, electrically connected in series to the laser and the chip capacitor, and includes a first terminal and a second terminal, wherein the first terminal of the chip inductor and the chip capacitor are bonded to each other; and an electrical wiring group in which the laser, the modulator, the chip capacitor, and the chip inductor are electrically connected to each other.

DETAILED DESCRIPTION

Figure 1:
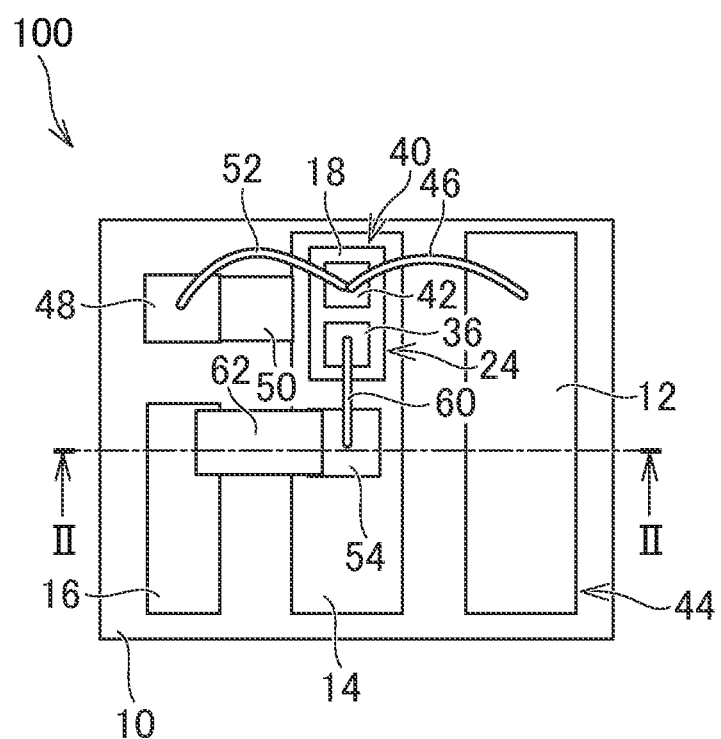
FIG. 1 is a plan view illustrating a semiconductor optical device according to a first embodiment.
Figure 2:
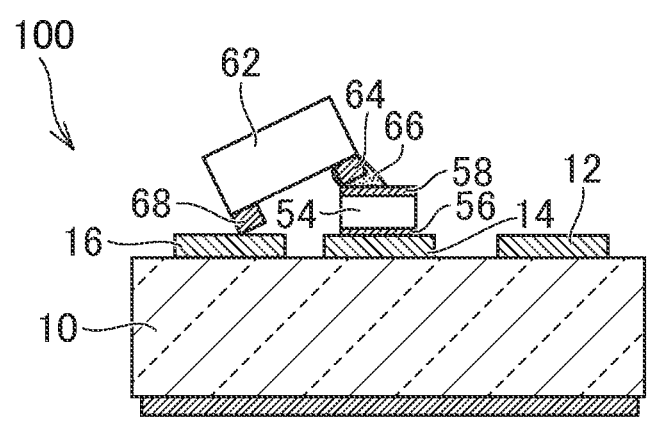
FIG. 2 is a cross-sectional view taken along line II-II illustrating the semiconductor optical device illustrated in FIG. 1.

Hereinafter, some embodiments will be described specifically and in detail with reference to drawings. In all the drawings to explain the embodiments, the members with the identical or same function bear the same reference numerals, and their repetitive description will be omitted. The drawings used below are only to explain examples in the embodiments, sizes of figures do not always comply with magnification in the examples FIG. 1 is a plan view illustrating a semiconductor optical device according to a first embodiment. FIG. 2 is a cross-sectional view taken along line II-II illustrating the semiconductor optical device illustrated in FIG. 1. The semiconductor optical device according to the first embodiment is a differential drive type. An semiconductor optical device 100 includes a first high frequency line 12, a second high frequency line 14, and a direct current line 16 that are mounted on a substrate 10 formed of an insulating material such as aluminum nitride. A modulator integrated laser 18 is mounted on the second high frequency line 14.

Figure 3:
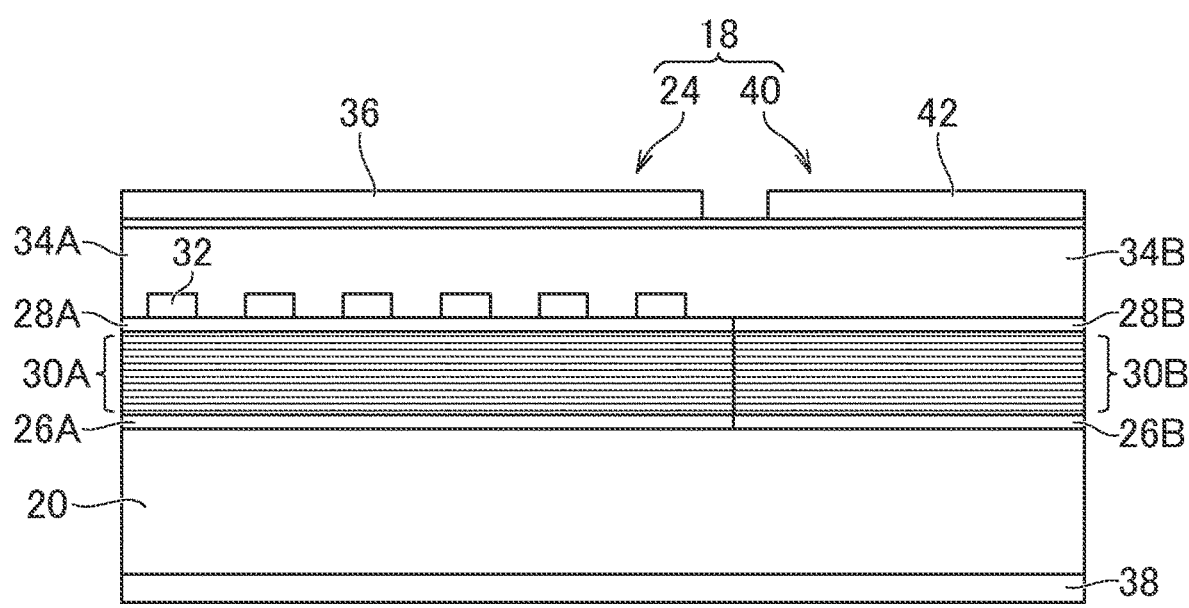
FIG. 3 is a longitudinal sectional view illustrating a modulator integrated laser.

FIG. 3 is a longitudinal sectional view illustrating the modulator integrated laser 18. The modulator integrated laser 18 has a structure in which elements are formed on a semiconductor substrate 20. The semiconductor substrate 20 is an n-type InP substrate.

The modulator integrated laser 18 includes a laser portion 24 for emitting light. The laser portion 24 includes a multiple quantum well 30A that is interposed between a lower SCH (Separated Confinement Heterostructure) layer 26A and an upper SCH layer 28A on the semiconductor substrate 20. A diffraction grating layer 32 is provided on the upper SCH layer 28A, and the upper SCH layer 28A is covered with a clad layer 34A. The laser portion 24 may be a distributed Bragg reflector (DBR) laser or a distributed feedback (DFB) laser. The laser portion 24 includes an electrode 36 (for example, an anode) and an electrode 38 (for example, a cathode) for applying a direct current voltage.

The modulator integrated laser 18 includes a modulation portion 40 for modulating the light using an electroabsorption effect. The modulation portion 40 includes a multiple quantum well 30B that is interposed between a lower SCH layer 26B and an upper SCH layer 28B on the semiconductor substrate 20. The upper SCH layer 28B is covered with a clad layer 34B. In the embodiment, the clad layer 34A and the clad layer 34B are the same as each other but may be formed of different materials. The modulation portion 40 includes an electrode 42 (for example, an anode) and the electrode 38 (for example, a cathode) for applying an alternating current voltage. The electrodes 38 of the laser portion 24 and the modulation portion 40 are integrated but may be separately provided. In addition, the modulation portion 40 and the laser portion 24 are not necessarily integrated on the same semiconductor substrate 20. For example, the modulation portion 40 and the laser portion 24 may be formed on different semiconductor substrates and may be mounted on a region (here, the second high frequency line 14) where the modulation portion 40 and the laser portion 24 have the same potential.

The semiconductor optical device 100 includes an electrical wiring group 44. The electrical wiring group 44 includes the direct current line 16 for applying a direct current voltage to the laser portion 24. The electrical wiring group 44 includes the first high frequency line 12 and the second high frequency line 14 for applying a high frequency signal to the modulation portion 40. A differential signal is transmitted to the first high frequency line 12 and the second high frequency line 14.

The electrode 42 of the modulation portion 40 is electrically connected to the first high frequency line 12. For the connection, a wire 46 is used. The electrode 38 common to the modulation portion 40 and the laser portion 24 is bonded to face the second high frequency line 14. The modulator integrated laser 18 is mounted to be electrically connected to the second high frequency line 14.

The electrical wiring group 44 includes a pad 48. The pad 48 and the second high frequency line 14 are connected through a matching resistor 50 for impedance matching. The pad 48 is electrically connected to the electrode 42 of the modulation portion 40 through a wire 52. Accordingly, the matching resistor 50 is connected in parallel to the modulation portion 40.

A chip capacitor 54 is mounted on the substrate 10. On the second high frequency line 14, the chip capacitor 54 is mounted in rear of the modulator integrated laser 18 such that a lower electrode 56 is conducted. The second high frequency line 14 includes a region where the laser portion 24 and the modulation portion 40 are mounted and a region where the chip capacitor 54 is mounted such that widths of the regions are the same as each other. An upper electrode 58 of the chip capacitor 54 is connected to the electrode 36 of the laser portion 24 through a wire 60.

A chip inductor 62 is mounted on the substrate 10. A first terminal 64 of the chip inductor 62 and the chip capacitor 54 (upper electrode 58) are directly bonded to each other through a solder 66 or a conductive adhesive.

A second terminal 68 of the chip inductor 62 is directly connected to the direct current line 16. Accordingly, as illustrated in FIG. 2, the chip inductor 62 is mounted in a state where it is tilted at a predetermined angle with respect to a mounting surface of the substrate 10. For the connection, a conductive adhesive or a solder (not illustrated) may be used.

Figure 4:
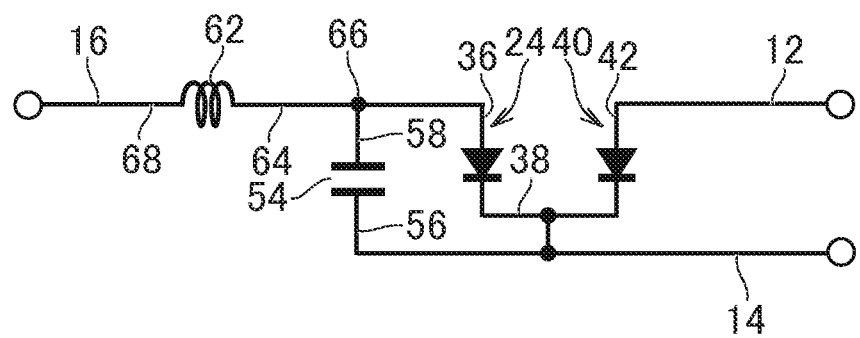
FIG. 4 is a circuit diagram illustrating the semiconductor optical device.

FIG. 4 is a circuit diagram illustrating the semiconductor optical device. The electrode 36 (anode) of the laser portion 24 is connected to the direct current line 16 through the chip inductor 62. On the other hand, the electrode 42 (anode) of the modulation portion 40 is connected to the first high frequency line 12. The laser portion 24 and the modulation portion 40 are connected to the second high frequency line 14 through the integrated electrode 38 (for example, a cathode).

The chip capacitor 54 is connected in parallel to the laser portion 24, and an alternating current component of a voltage applied to the laser portion 24 is released. The chip inductor 62 is electrically connected in series to the chip capacitor 54, and is connected in series to the laser portion 24. The chip inductor 62 is electrically connected in series to the laser portion 24 and the chip capacitor 54 as a whole.

Figure 5:
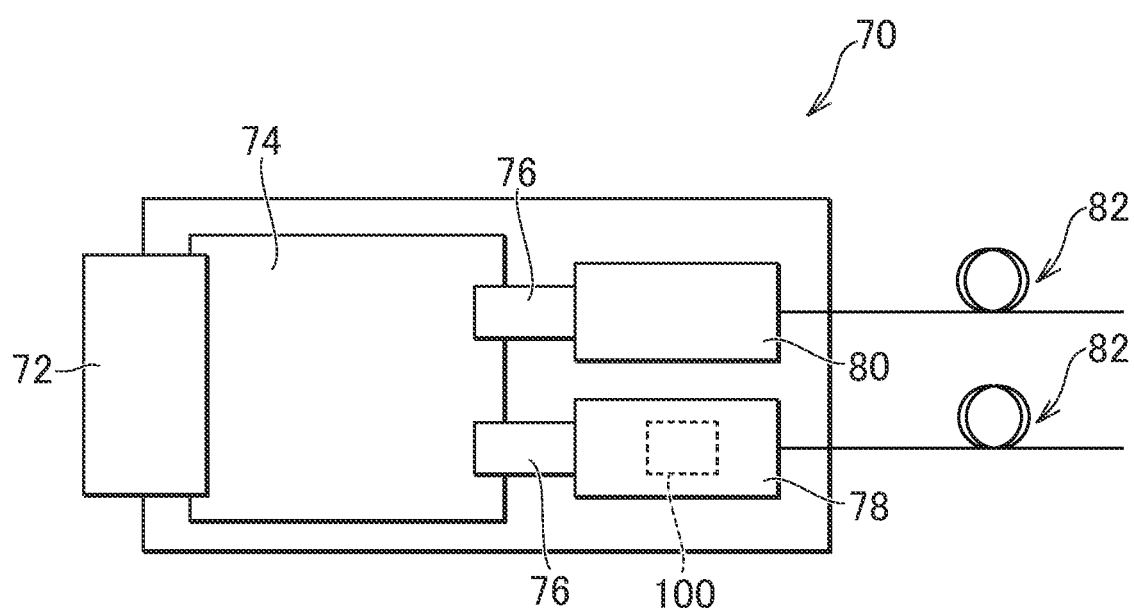
FIG. 5 is a schematic diagram illustrating an optical module according to the first embodiment.

FIG. 5 is a schematic diagram illustrating an optical module according to the first embodiment. An optical module 70 is an optical transceiver having a transmission function and a reception function, for example, at a bit rate in the order of 100 Gbit/s, and is based on the MSA (Multi-Source Agreement) standard of QSFP28 (Quad Small Form-Factor Pluggable 28). The optical module 70 is used in a state where it is mounted on a data transmission equipment (not illustrated) using an electrical connector 72. The data transmission equipment is, for example, a high-capacity router or switch. The data transmission equipment has, for example, a switching function and is arranged in a base station or the like.

The optical module 70 includes a printed substrate 74, a flexible substrate 76, a transmitter optical subassembly 78 for converting an electrical signal into an optical signal, and a receiver optical subassembly 80 for converting an optical signal into an electrical signal. In the transmitter optical subassembly 78, the semiconductor optical device 100 illustrated in FIG. 1 is embedded, and an electrical signal is converted into an optical signal by the modulator integrated laser 18. In the receiver optical subassembly 80, a light receiving element that converts an optical signal into an electrical signal is embedded. In order to input or output an optical signal, an optical fiber 82 is connected to each of the transmitter optical subassembly 78 and the receiver optical subassembly 80.

The printed substrate 74 is a rigid substrate having no flexibility. The printed substrate 74 is connected to each of the transmitter optical subassembly 78 and the receiver optical subassembly 80 through the flexible substrate 76. An electrical signal is transmitted from the printed substrate 74 to the transmitter optical subassembly 78 through the flexible substrate 76. In addition, an electrical signal is transmitted from the receiver optical subassembly 80 to the printed substrate 74 through the flexible substrate 76.

Figure 6:
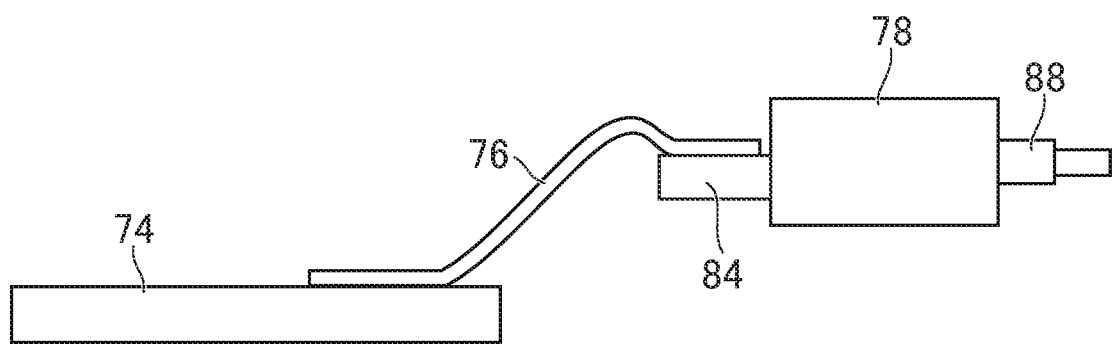
FIG. 6 is a schematic diagram illustrating a transmitter optical subassembly, a printed substrate, and a flexible substrate.

FIG. 6 is a schematic diagram illustrating the transmitter optical subassembly 78, the printed substrate 74, and the flexible substrate 76. The transmitter optical subassembly 78 is connected to one end portion of the flexible substrate 76 through a feedthrough 84. Another end portion of the flexible substrate 76 is electrically connected to overlap the printed substrate 74.

Figure 7:
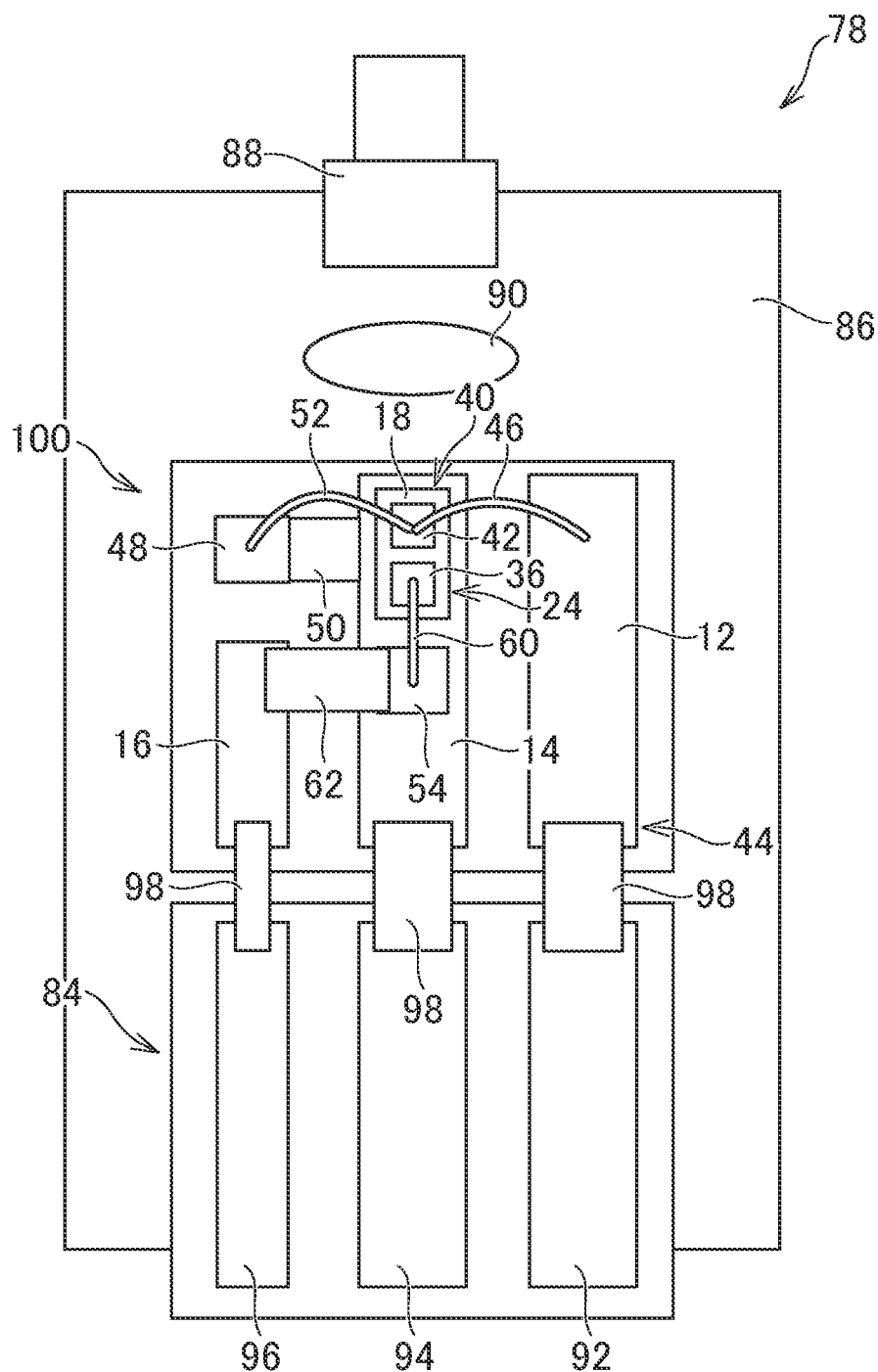
FIG. 7 is a plan view illustrating the transmitter optical subassembly according to the first embodiment.

FIG. 7 is a plan view illustrating the transmitter optical subassembly 78 according to the first embodiment. A receptacle 88 that is connected to the optical fiber 82 illustrated in FIG. 5 is attached to a case 86 of the transmitter optical subassembly 78. Light incident on the optical fiber 82 is collected by a lens 90 that is provided in the case 86. The feedthrough 84 is provided in the case 86 for connection to the flexible substrate 76 illustrated in FIG. 6. The feedthrough 84 includes high-frequency lines 92, 94, and a direct current line 96.

The semiconductor optical device 100 is built in the transmitter optical subassembly 78. The temperature of the semiconductor optical device 100 may be adjusted by a thermoelectric element such as a Peltier element. The first high frequency line 12 and the second high frequency line 14 are connected to each of the high frequency line 92 and the high frequency line 94 of the feedthrough 84 to form a differential transmission path. For the connection, a ribbon wire 98 is used. The direct current line 16 of the semiconductor optical device 100 is connected to the direct current line 96 of the feedthrough 84 through the ribbon wire 98.

A high frequency signal for differential signal transmission is input to each of the first high frequency line 12 and the second high frequency line 14. The high frequency signal is applied to each of the electrode 42 and the electrode 38 of the modulation portion 40. On the other hand, since the electrodes 38 of the laser portion 24 and the modulation portion 40 are electrically connected to each other, a voltage including an alternating current component is also applied to the laser portion 24. Since the alternating current component is likely to pass through the chip capacitor 54, the amount of the alternating current component flowing to the laser portion 24 is reduced to some extent. In the embodiment, since the chip inductor 62 is connected in series to the electrode 36, the flow of an alternating current to the laser portion 24 is further suppressed.

Figure 8:
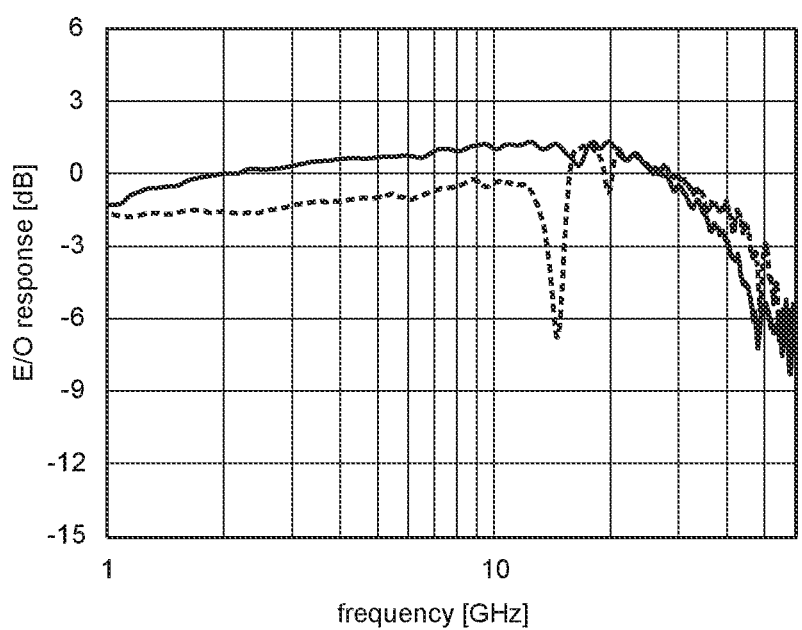
FIG. 8 is a diagram illustrating frequency response characteristics of the transmitter optical subassembly illustrated in FIG. 7.

FIG. 8 is a diagram illustrating E (electrical signal)/O (optical signal) frequency response characteristics of the transmitter optical subassembly 78 illustrated in FIG. 7. In FIG. 8, a solid line represents characteristics of the transmitter optical subassembly 78 using the semiconductor optical device 100 according to the embodiment. In addition, a broken line represents characteristics of a transmitter optical subassembly using a semiconductor optical device according to Comparative Example.

In the semiconductor optical device according to Comparative Example, the upper electrode 58 of the chip capacitor 54 and the first terminal 64 of the chip inductor 62 are connected to each other using a wire. Other configurations are the same as those of the semiconductor optical device 100 according to the embodiment. In the broken line of FIG. 8, a high resonance is generated in the vicinity of 15 GHz. The reason for this is that the flow of an alternating current to the laser portion 24 cannot be sufficiently suppressed due to a parasitic inductance or a parasitic capacitance of the wire that connects the upper electrode 58 of the chip capacitor 54 and the first terminal 64 of the chip inductor 62. Therefore, during actual data transmission, the signal quality largely deteriorates. On the other hand, in the solid line using the semiconductor optical device 100 according to the embodiment, an unnecessary resonance is not generated. Accordingly, it can be seen that, by using the semiconductor optical device 100 according to the embodiment, signal transmission can be performed with a higher quality than that of the configuration according to Comparative Example.

According to the embodiment, in the configuration in which the leakage of the high frequency component from the modulation portion 40 of the modulator integrated laser 18 to the laser portion 24 is suppressed by a passive circuit using the chip inductor 62 and the chip capacitor 54, parasitic components generated by wire connection can be reduced to the minimum, and excellent frequency characteristics can be achieved.

Figure 9:
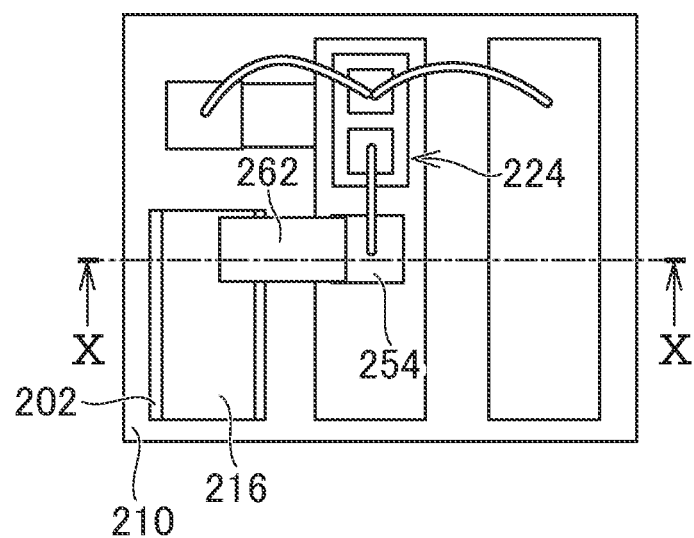
FIG. 9 is a plan view illustrating a semiconductor optical device according to a second embodiment.
Figure 10:
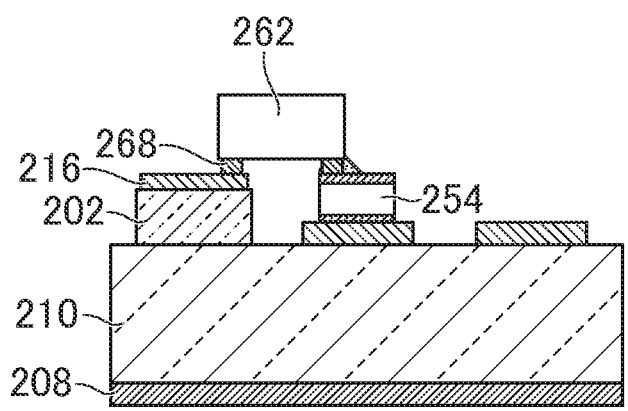
FIG. 10 is a cross-sectional view taken along line X-X illustrating the semiconductor optical device illustrated in FIG. 9.

FIG. 9 is a plan view illustrating a semiconductor optical device according to a second embodiment. FIG. 10 is a cross-sectional view taken along line X-X illustrating the semiconductor optical device illustrated in FIG. 9. The second embodiment is different from the first embodiment, in that an insulating block 202 is mounted on a substrate 210. The insulating block 202 is interposed between a chip inductor 262 and the substrate 210. A direct current line 216 for applying a direct current voltage to a laser portion 224 is provided on a surface of the insulating block 202 opposite to the substrate 210. The direct current line 216 is interposed between the insulating block 202 and the chip inductor 262. In addition, the insulating block 202 is arranged such that at least a part of the direct current line 216 is positioned immediately below a second terminal 268 of the chip inductor 262.

As illustrated in FIG. 10, the second terminal 268 of the chip inductor 262 is directly connected to the direct current line 216. The second terminal 268 and the direct current line 216 are bonded and fixed through a conductive adhesive (not illustrated) but may be fixed through a solder. Further, the thickness of the insulating block 202 can be adjusted such that the chip inductor 262 is not tilted with respect to a mounting surface of the substrate 210. Therefore, even in any case, stable mounting can be performed on chip capacitors 254 having various thicknesses. Therefore, the degree of freedom for design is improved. Further, the effective distance between the second terminal 268 and a back surface electrode 208 can be increased, and a parasitic capacitance generated by a difference in potential therebetween can be reduced. Other contents correspond to the contents described in the first embodiment.

Figure 11:
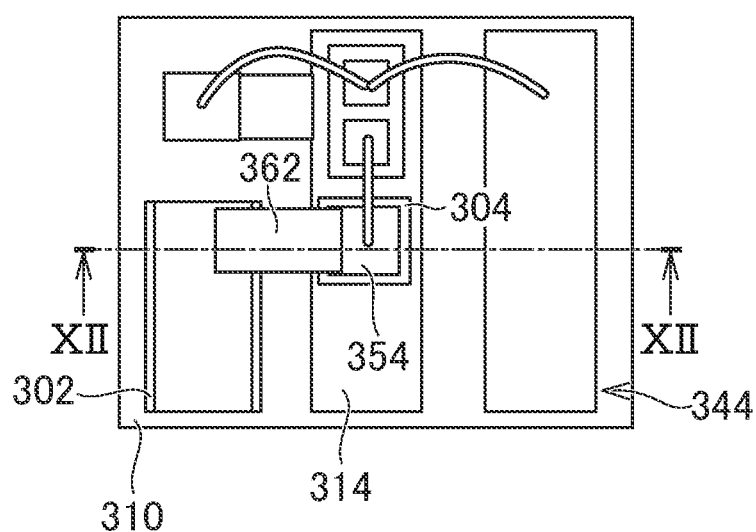
FIG. 11 is a plan view illustrating a semiconductor optical device according to a third embodiment.
Figure 12:
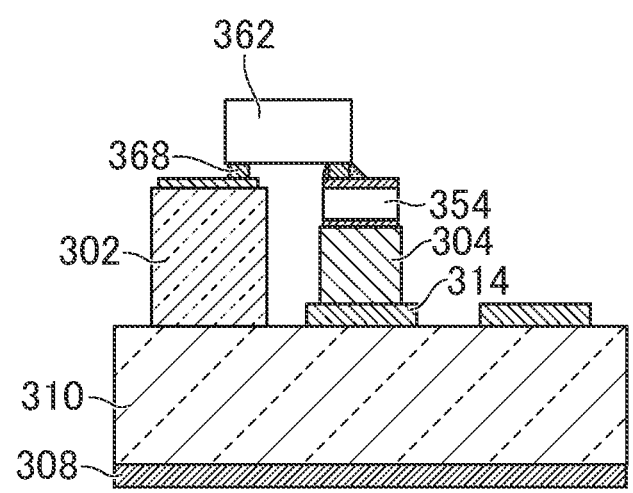
FIG. 12 is a cross-sectional view taken along line XII-XII illustrating the semiconductor optical device illustrated in FIG. 11.

FIG. 11 is a plan view illustrating a semiconductor optical device according to a third embodiment. FIG. 12 is a cross-sectional view taken along line XII-XII illustrating the semiconductor optical device illustrated in FIG. 11. The third embodiment is different from the second embodiment, in that a conductive block 304 is arranged immediately below a chip capacitor 354. The conductive block 304 is interposed between the chip capacitor 354 and an electrical wiring group 344 (second high frequency line 314). The size of the conductive block 304 is designed not to exceed the width of the second high frequency line 314. In addition, as illustrated in FIG. 12, the thickness of an insulating block 302 is adjusted according to the thicknesses of both the conductive block 304 and the chip capacitor 354 such that a chip inductor 362 is not tilted with respect to a mounting surface of a substrate 310. That is, by adjusting the thickness of the conductive block 304, the thickness of the insulating block 302 can be freely adjusted. Accordingly, the insulating block 302 can be set to be thicker than that of the second embodiment. Therefore, the effective distance between a second terminal 368 and a back surface electrode 308 can be set to be more than that of the second embodiment, and a parasitic capacitance generated by a difference in potential therebetween can be further reduced. Other contents correspond to the contents described in the second embodiment.

Figure 13:
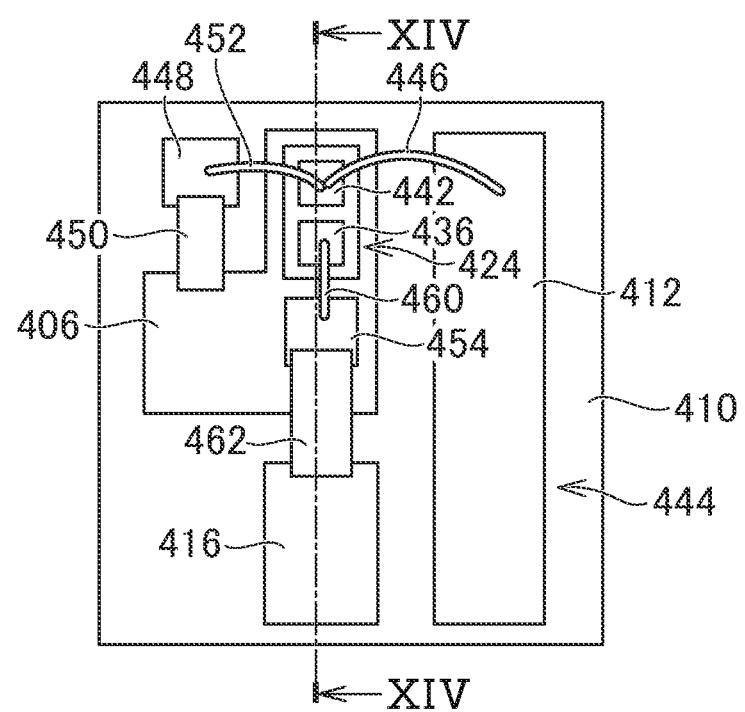
FIG. 13 is a plan view illustrating a semiconductor optical device according to a fourth embodiment.
Figure 14:
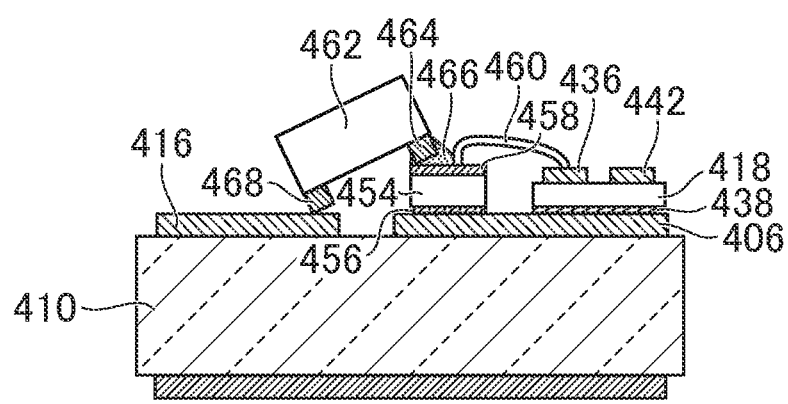
FIG. 14 is a cross-sectional view taken along line XIV-XIV illustrating the semiconductor optical device illustrated in FIG. 13.

FIG. 13 is a plan view illustrating a semiconductor optical device according to a fourth embodiment. In addition, FIG. 14 is a cross-sectional view taken along line XIV-XIV illustrating the semiconductor optical device illustrated in FIG. 13. The semiconductor optical device according to the embodiment is a single-end drive type.

The semiconductor optical device includes a high frequency line 412, a ground pattern 406, and a direct current line 416 on a substrate 410 formed of an insulating material such as aluminum nitride. An electrical wiring group 444 includes the high frequency line 412 and the ground pattern 406 for applying a high frequency signal to a modulation portion 440. A pad 448 and the ground pattern 406 are connected to each other through a matching resistor 450.

A laser portion 424 and the modulation portion 440 are mounted to be electrically connected to the ground pattern 406. A modulator integrated laser 418 is bonded to the ground pattern 406 to face an electrode 438. The high frequency line 412 is electrically connected to an electrode 442 of the modulation portion 440. For the connection, a wire 446 is used. The pad 448 is electrically connected to the electrode 442 of the modulation portion 440 through a wire 452. Accordingly, the matching resistor 450 is connected in parallel to the modulation portion 440.

A chip capacitor 454 is mounted to be electrically connected to the ground pattern 406 in rear of the laser portion 424. On the ground pattern 406, the chip capacitor 454 is mounted in rear of the modulator integrated laser 418 such that a lower electrode 456 is conducted. An upper electrode 458 of the chip capacitor 454 is connected to an electrode 436 of the laser portion 424 through a wire 460. Accordingly, the chip capacitor 454 is connected in parallel to the laser portion 424, and an alternating current component of a voltage applied to the laser portion 424 is released.

The semiconductor optical device includes a chip inductor 462. As illustrated in FIG. 14, a first terminal 464 of the chip inductor 462 is directly connected to the upper electrode 458 of the chip capacitor 454. In addition, a second terminal 468 is directly connected to the direct current line 416. Accordingly, the chip inductor 462 is mounted in a state where it is tilted at a predetermined angle with respect to a mounting surface of the substrate 410. The first terminal 464 and the upper electrode 458 of the chip capacitor 454 are directly connected to each other through a solder 466 or a conductive adhesive. The second terminal 468 and the direct current line 416 are bonded and fixed through a conductive adhesive or a solder (not illustrated). As a result, the chip inductor 462 is electrically connected in series to the chip capacitor 454, and is connected in series to the laser portion 424.

Figure 15:
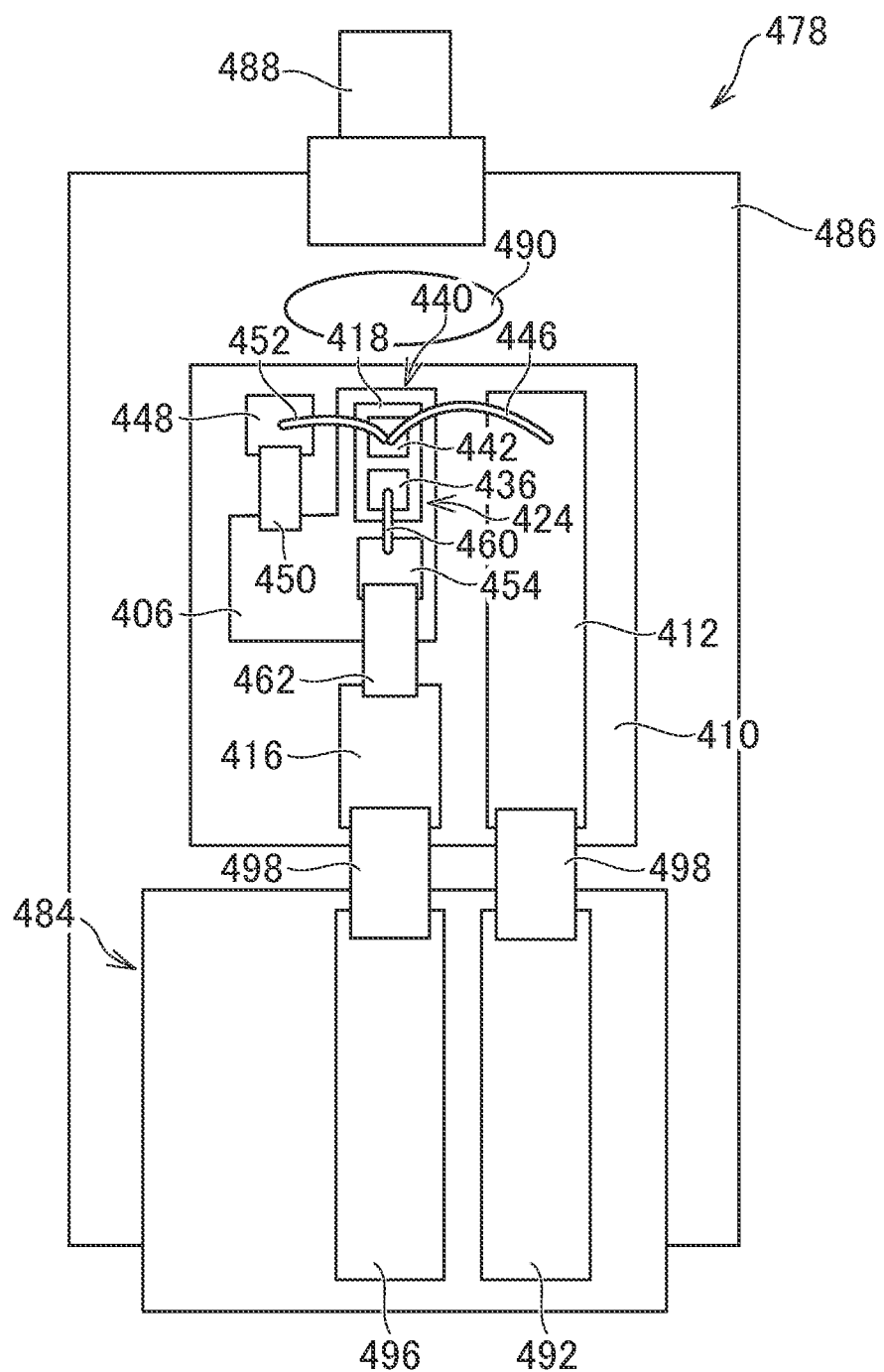
FIG. 15 is a schematic diagram illustrating the transmitter optical subassembly on which a semiconductor optical element according to the embodiment is mounted.

FIG. 15 is a schematic diagram illustrating the transmitter optical subassembly on which the semiconductor optical element according to the embodiment is mounted. The temperature of the semiconductor optical device may be adjusted by a thermoelectric element such as a Peltier element. A transmitter optical subassembly 478 includes a feedthrough 484. The feedthrough 484 includes a high frequency line 492 and a direct current line 496. The high frequency line 412 and the high frequency line 492 are electrically connected to each other and the direct current line 416 and the direct current line 496 are electrically connected to each other through a ribbon wire 498. In a case 486 of the transmitter optical subassembly 478, a receptacle 488 for connection to an optical fiber and a lens 490 for collecting light to an optical fiber are provided.

A high frequency signal is input to the high frequency line 412. A high frequency signal is applied to the electrode 442 of the modulation portion 440. A part of the high frequency signal applied to the electrode 442 is transmitted as a crosstalk noise through the inside of the modulator integrated laser 418 or the like, and a voltage including an alternating current component is also applied to the laser portion 424. Since the alternating current component is likely to pass through the chip capacitor 454, the amount of the alternating current component flowing to the laser portion 424 is reduced to some extent. In the embodiment, since the chip inductor 462 is connected in series to the electrode 436, the flow of an alternating current to the laser portion 424 is further suppressed.

In the semiconductor optical device according to the fourth embodiment, the chip capacitor 454 and the chip inductor 462 are directly connected to each other without using a wire. Therefore, an unnecessary resonance is not generated. Accordingly, it can be seen that, by using the semiconductor optical device according to the embodiment, signal transmission can performed with a higher quality than that of the configuration according to Comparative Example in which the chip capacitor 454 and the chip inductor 462 are connected through a wire. Other contents correspond to the contents described in the first embodiment.

Figure 16:
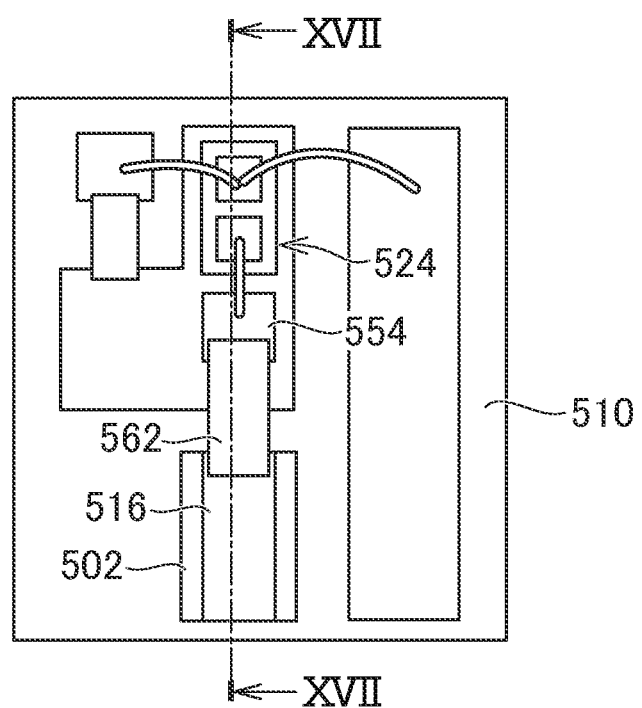
FIG. 16 is a plan view illustrating a semiconductor optical device according to a fifth embodiment.
Figure 17:
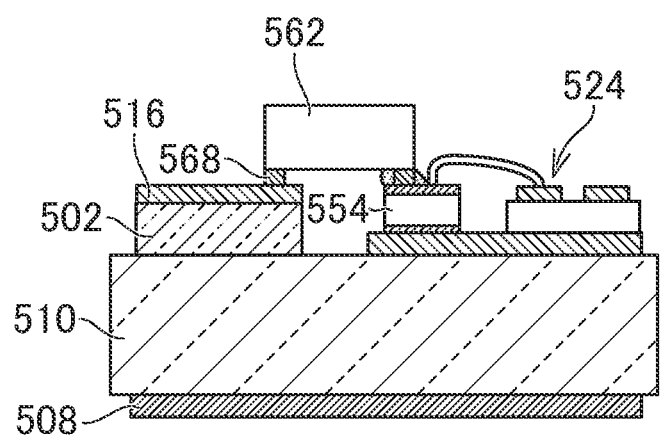
FIG. 17 is a cross-sectional view taken along line XVII-XVII illustrating the semiconductor optical device illustrated in FIG. 16.

FIG. 16 is a plan view illustrating a semiconductor optical device according to a fifth embodiment. FIG. 17 is a cross-sectional view taken along line XVII-XVII illustrating the semiconductor optical device illustrated in FIG. 16. The fifth embodiment is different from the fourth embodiment, in that an insulating block 502 is mounted on a substrate 510. The insulating block 502 is interposed between a chip inductor 562 and the substrate 510.

A direct current line 516 for applying a direct current voltage to a laser portion 524 is provided on a surface of the insulating block 502 opposite to the substrate 510. The direct current line 516 is interposed between the insulating block 502 and the chip inductor 562. At least a part of the direct current line 516 is positioned immediately below a second terminal 568 of the chip inductor 562.

As illustrated in FIG. 17, the second terminal 568 of the chip inductor 562 is directly connected to the direct current line 516. The second terminal 568 and the direct current line 516 are bonded and fixed through a conductive adhesive (not illustrated) but may be fixed through a solder. The thickness of the insulating block 502 can be adjusted such that the chip inductor 562 is not tilted with respect to a mounting surface of the substrate 510. Therefore, even in any case, stable mounting can be performed on chip capacitors 554 having various thicknesses. Therefore, the degree of freedom for design is improved. Further, the effective distance between the second terminal 568 and a back surface electrode 508 can be increased, and a parasitic capacitance generated by a difference in potential therebetween can be reduced. Other contents correspond to the contents described in the fourth embodiment.

Figure 18:
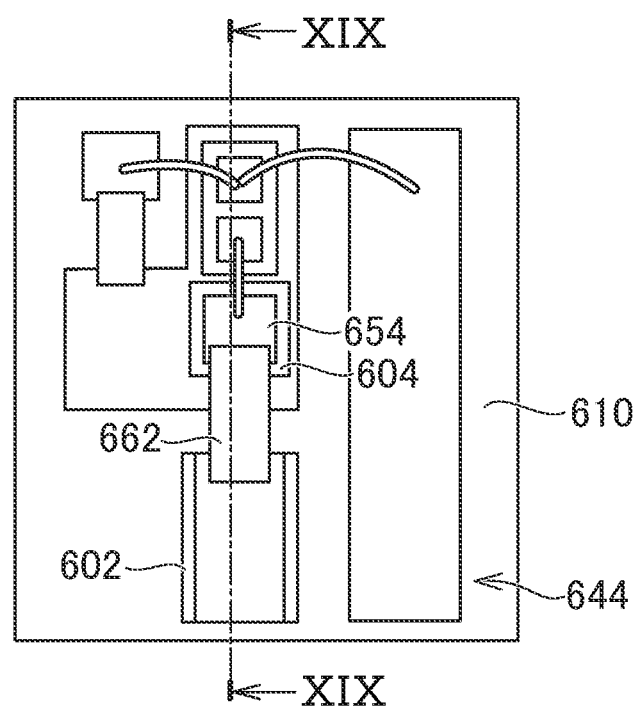
FIG. 18 is a plan view illustrating a semiconductor optical device according to a sixth embodiment.
Figure 19:
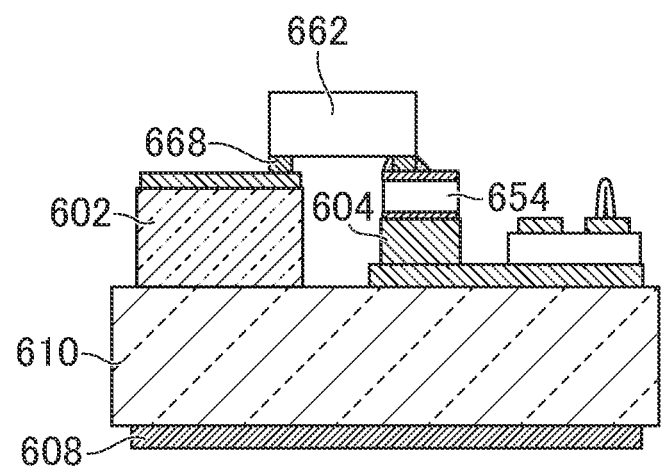
FIG. 19 is a cross-sectional view taken along line XIX-XIX illustrating the semiconductor optical device illustrated in FIG. 18.

FIG. 18 is a plan view illustrating a semiconductor optical device according to a sixth embodiment. FIG. 19 is a cross-sectional view taken along line XIX-XIX illustrating the semiconductor optical device illustrated in FIG. 18. The sixth embodiment is different from the fifth embodiment, in that a conductive block 604 is arranged immediately below a chip capacitor 654. The conductive block 604 is interposed between the chip capacitor 654 and an electrical wiring group 644.

As illustrated in FIG. 19, the thickness of an insulating block 602 is adjusted according to the thicknesses of both the conductive block 604 and the chip capacitor 654 such that a chip inductor 662 is not tilted with respect to a mounting surface of a substrate 610. That is, by adjusting the thickness of the conductive block 604, the thickness of the insulating block 602 can be freely adjusted. Accordingly, the insulating block 602 can be set to be thicker than that of the fifth embodiment. Therefore, the effective distance between a second terminal 668 and a back surface electrode 608 can be set to be more than that of the fifth embodiment, and a parasitic capacitance generated by a difference in potential therebetween can be further reduced. Other contents correspond to the contents described in the fifth embodiment.

Figure 20:
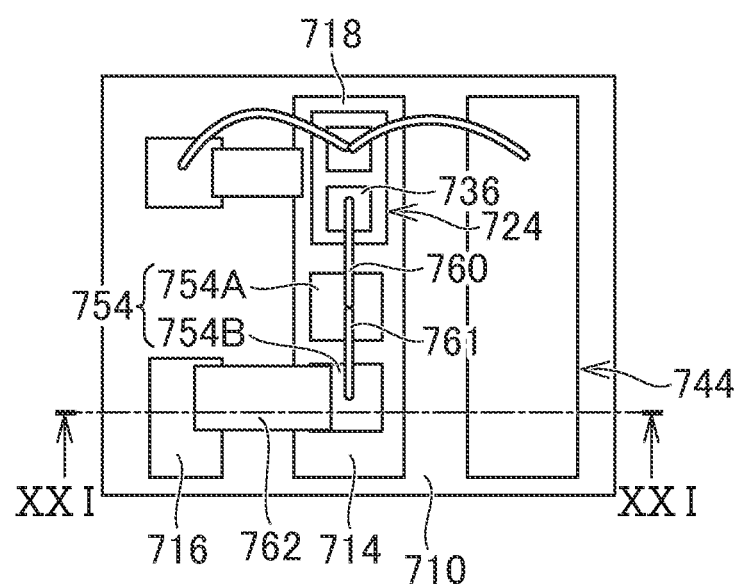
FIG. 20 is a plan view illustrating a semiconductor optical device according to a seventh embodiment.
Figure 21:
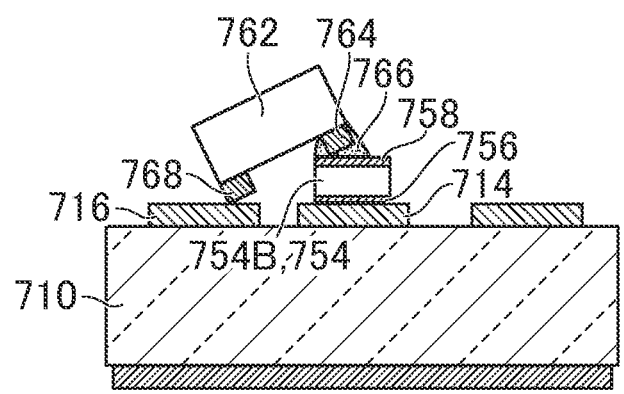
FIG. 21 is a cross-sectional view taken along line XXI-XXI illustrating the semiconductor optical device illustrated in FIG. 20.

FIG. 20 is a plan view illustrating a semiconductor optical device according to a seventh embodiment. FIG. 21 is a cross-sectional view taken along line XXI-XXI illustrating the semiconductor optical device illustrated in FIG. 20. The seventh embodiment is different from the first embodiment, in that two chip capacitors 754A and 754B are mounted in rear of a modulator integrated laser 718 on a second high frequency line 714.

The chip capacitor 754 includes the chip capacitors 754A and 754B that are electrically connected in parallel to each other. Each of the chip capacitors 754A and 754B includes a lower electrode 756 and an upper electrode 758, the lower electrode 756 being bonded to an electrical wiring group 744. Each of the chip capacitors 754A and 754B is mounted on the second high frequency line 714 such that the lower electrode 756 is conducted.

The upper electrodes 758 of a pair of adjacent chip capacitors 754A and 754B are electrically connected to each other through a wire 761. The upper electrode 758 of the chip capacitor 754A is connected to an electrode 736 of a laser portion 724 through a wire 760. Accordingly, the chip capacitor 754A and 754B are connected in parallel to the laser portion 724, and an alternating current component of a voltage applied to the laser portion 724 is released.

The semiconductor optical device includes a chip inductor 762. A first terminal 764 of the chip inductor 762 is directly bonded to one (the upper electrode 758 of the chip capacitor 754B) of the chip capacitors 754A and 754B through a solder 766 or a conductive adhesive.

In addition, a second terminal 768 is directly connected to a direct current line 716. Accordingly, as illustrated in FIG. 21, the chip inductor 762 is mounted in a state where it is tilted at a predetermined angle with respect to a mounting surface of a substrate 710. The second terminal 768 and the direct current line 716 are bonded and fixed through a conductive adhesive (not illustrated). For the bonding and fixing, a solder may be used. As a result, the chip inductor 762 is electrically connected in series to the chip capacitor 754, and is connected in series to the laser portion 724.

In the seventh embodiment, the two chip capacitors 754A and 754B are mounted. Therefore, the effective capacitance of the chip capacitor 754 that is connected in parallel to the laser portion 724 can be set to be higher than that of the first embodiment. Therefore, a voltage of an alternating current component applied to the laser portion 724 can be more effectively released as compared to the first embodiment. The capacitances of the chip capacitors 754A and 754B may be the same as or different from each other. Further, a larger number of the chip capacitors 754 more than two can also be connected in parallel to the laser portion 724. Other contents correspond to the contents described in the first embodiment.

Figure 22:
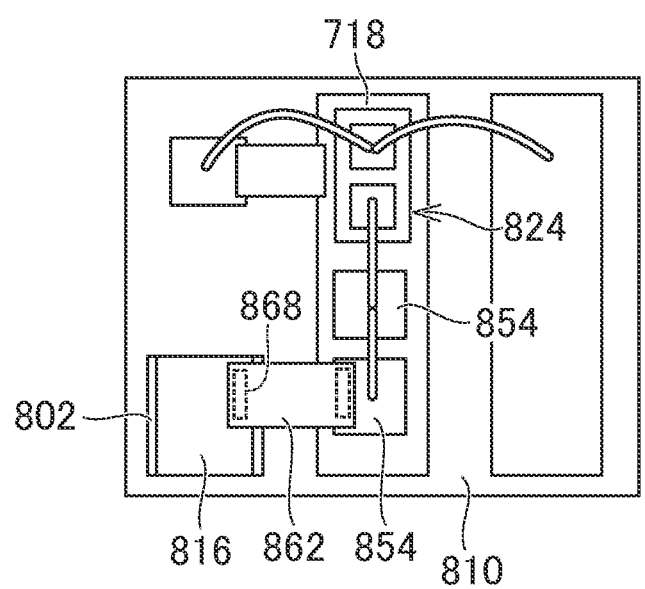
FIG. 22 is a plan view illustrating a semiconductor optical device according to an eighth embodiment.

FIG. 22 is a plan view illustrating a semiconductor optical device according to an eighth embodiment. The eighth embodiment is different from the seventh embodiment, in that an insulating block 802 is mounted on a substrate 810. The insulating block 802 is interposed between a chip inductor 862 and the substrate 810.

A direct current line 816 is interposed between the insulating block 802 and the chip inductor 862 and is directly connected to a second terminal 868. The direct current line 816 for applying a direct current voltage to a laser portion 824 is provided on a surface of the insulating block 802 opposite to the substrate 810. In addition, at least a part of the direct current line 816 is positioned immediately below the second terminal 868 of the chip inductor 862.

The second terminal 868 of the chip inductor 862 is directly connected to the direct current line 816. The second terminal 868 and the direct current line 816 are bonded and fixed through a conductive adhesive (not illustrated) but may be fixed through a solder. Further, the thickness of the insulating block 802 can be adjusted such that the chip inductor 862 is not tilted with respect to a mounting surface of the substrate 810. Therefore, even in any case, stable mounting can be performed on chip capacitors 854 having various thicknesses. Therefore, the degree of freedom for design is improved. Further, the effective distance between the second terminal 868 and a back surface electrode (not illustrated) can be increased, and a parasitic capacitance generated by a difference in potential therebetween can be reduced. Other contents correspond to the contents described in the seventh embodiment.

Figure 23:
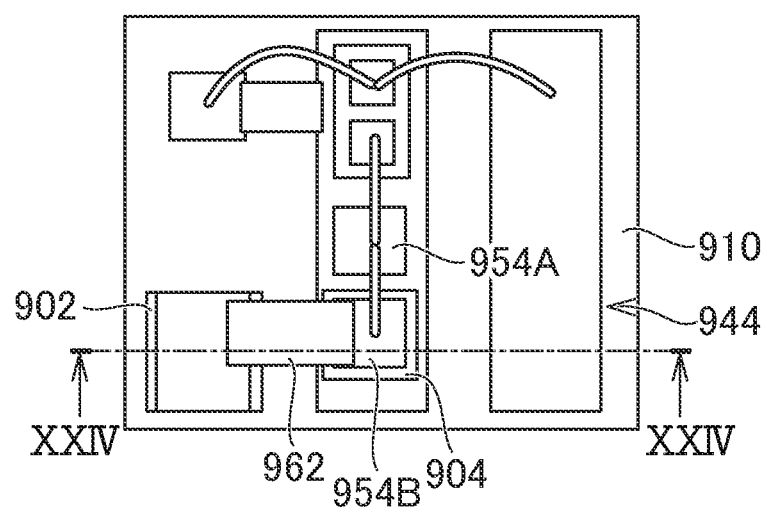
FIG. 23 is a plan view illustrating a semiconductor optical device according to a ninth embodiment.
Figure 24:
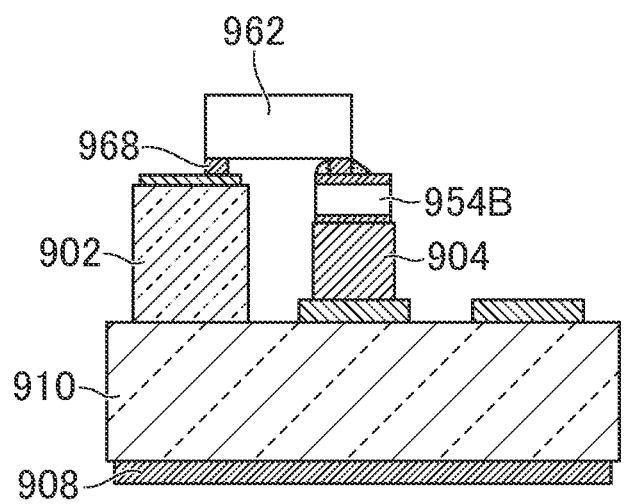
FIG. 24 is a cross-sectional view taken along line XXIV-XXIV illustrating the semiconductor optical device illustrated in FIG. 23.

FIG. 23 is a plan view illustrating a semiconductor optical device according to a ninth embodiment. FIG. 24 is a cross-sectional view taken along line XXIV-XXIV illustrating the semiconductor optical device illustrated in FIG. 23. The ninth embodiment is different from the eighth embodiment, in that a conductive block 904 is arranged immediately below one of a plurality of chip capacitors 954A and 954B. The conductive block 904 is interposed between the chip capacitor 954B and an electrical wiring group 944.

As illustrated in FIG. 24, the thickness of an insulating block 902 is adjusted according to the thicknesses of both the conductive block 904 and the chip capacitor 954B such that a chip inductor 962 is not tilted with respect to a mounting surface of a substrate 910. That is, by adjusting the thickness of the conductive block 904, the thickness of the insulating block 902 can be freely adjusted. Accordingly, the insulating block 902 can be set to be thicker than that of the eighth embodiment. Therefore, the effective distance between a second terminal 968 and a back surface electrode 908 can be set to be more than that of the eighth embodiment, and a parasitic capacitance generated by a difference in potential therebetween can be further reduced. Other contents correspond to the contents described in the eighth embodiment.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical device comprising:
   a laser for emitting light;
   a modulator for modulating the light using an electroabsorption effect;
   a chip capacitor that is electrically connected in parallel to the laser;
   a chip inductor that is electrically connected in series to the chip capacitor, electrically connected in series to the laser and the chip capacitor, and includes a first terminal and a second terminal;
   a solder or a conductive adhesive that directly bonds the first terminal of the chip inductor and the chip capacitor to each other;
   an electrical wiring group in which the laser, the modulator, the chip capacitor, and the chip inductor are electrically connected to each other; and
   a substrate on which the laser, the modulator, the chip capacitor, and the chip inductor are mounted.

2. The semiconductor optical device of claim 1, wherein:
   the electrical wiring group includes a first high frequency line and a second high frequency line for applying a high frequency signal to the modulator,
   the laser and the modulator are mounted to be electrically connected to the second high frequency line,
   the chip capacitor is mounted to be electrically connected to the second high frequency line in rear of the laser,
   the second high frequency line includes a region where the laser and the modulator are mounted and another region where the chip capacitor is mounted such that a respective width of each region is the same, and
   a differential signal is transmitted to the first high frequency line and the second high frequency line.

3. The semiconductor optical device of claim 1, wherein:
   the electrical wiring group includes a high frequency line and a ground pattern for applying a high frequency signal to the modulator,
   the laser and the modulator are mounted to be electrically connected to the ground pattern, and
   the chip capacitor is mounted to be electrically connected to the ground pattern in rear of the laser.

4. The semiconductor optical device of claim 1, wherein:
   the electrical wiring group includes a direct current line for injecting a current to the laser, and
   the second terminal of the chip inductor is connected to the direct current line.

5. The semiconductor optical device of claim 4, further comprising:
   an insulating block that is interposed between the chip inductor and the substrate,
   wherein the direct current line is interposed between the insulating block and the chip inductor and is directly connected to the second terminal.

6. The semiconductor optical device of claim 1, further comprising:
   a conductive block that is interposed between the chip capacitor and the electrical wiring group.

7. The semiconductor optical device of claim 1, further comprising:
   a wire that connects an upper electrode and an electrode of the laser to each other,
   wherein the chip capacitor includes a lower electrode that is bonded to the electrical wiring group and the upper electrode that is bonded to the first terminal of the chip inductor.

8. The semiconductor optical device of claim 1, wherein:
   the chip capacitor includes a plurality of chip capacitors that are electrically connected in parallel to each other, and the first terminal of the chip inductor is directly bonded to a chip capacitor, of the plurality of chip capacitors, using the solder or the conductive adhesive.

9. The semiconductor optical device of claim 8, further comprising:
a wire that electrically connects an upper electrode of a pair of adjacent chip capacitors to each other,
wherein each chip capacitor, of the pair of adjacent chip capacitors, includes a lower electrode and the upper electrode,
the lower electrode being bonded to the electrical wiring group.

10. The semiconductor optical device of claim 9, wherein the first terminal of the chip inductor is bonded to the upper electrode of a chip capacitor of the pair of adjacent chip capacitors.

11. A device comprising:
a laser for emitting light;
a modulator for modulating the light;
a chip capacitor that is electrically connected in parallel to the laser;
a chip inductor that is electrically connected in series to the chip capacitor, electrically connected in series to the laser and the chip capacitor, and includes a first terminal and a second terminal,
wherein the first terminal of the chip inductor and the chip capacitor are bonded to each other; and
an electrical wiring group in which the laser, the modulator, the chip capacitor, and the chip inductor are electrically connected to each other.

12. The device of claim 11, wherein:
the electrical wiring group includes a first high frequency line and a second high frequency line for applying a high frequency signal to the modulator,
the laser and the modulator are mounted to be electrically connected to the second high frequency line,
the chip capacitor is mounted to be electrically connected to the second high frequency line in rear of the laser,
the second high frequency line includes a region where the laser and the modulator are mounted and another region where the chip capacitor is mounted such that a respective width of each region is the same, and
a differential signal is transmitted to the first high frequency line and the second high frequency line.

13. The device of claim 11, wherein:
the electrical wiring group includes a high frequency line and a ground pattern for applying a high frequency signal to the modulator,
the laser and the modulator are mounted to be electrically connected to the ground pattern, and
the chip capacitor is mounted to be electrically connected to the ground pattern in rear of the laser.

14. The device of claim 11, wherein:
the electrical wiring group includes a direct current line for injecting a current to the laser, and
the second terminal of the chip inductor is connected to the direct current line.

15. The device of claim 14, further comprising:
an insulating block that is interposed between the chip inductor and a substrate,
wherein the direct current line is interposed between the insulating block and the chip inductor and is directly connected to the second terminal.

16. The device of claim 11, further comprising:
a conductive block that is interposed between the chip capacitor and the electrical wiring group.

17. The device of claim 11, further comprising:
a wire that connects an upper electrode and an electrode of the laser to each other,
wherein the chip capacitor includes a lower electrode that is bonded to the electrical wiring group and the upper electrode that is bonded to the first terminal of the chip inductor.

18. The device of claim 11, wherein:
the chip capacitor includes a plurality of chip capacitors that are electrically connected in parallel to each other, and
the first terminal of the chip inductor is directly bonded to a chip capacitor, of the plurality of chip capacitors, using solder or a conductive adhesive.

19. The device of claim 18, further comprising:
a wire that electrically connects an upper electrode of a pair of adjacent chip capacitors to each other,
wherein each chip capacitor, of the pair of adjacent chip capacitors, includes a lower electrode and the upper electrode,
the lower electrode being bonded to the electrical wiring group.

20. The device of claim 19, wherein the first terminal of the chip inductor is bonded to the upper electrode of a chip capacitor of the pair of adjacent chip capacitors.

* * * * *